US010660194B2

(12) United States Patent
Ito

(10) Patent No.: US 10,660,194 B2
(45) Date of Patent: May 19, 2020

(54) HEAT CONDUCTING MEMBER, PRINTED CIRCUIT BOARD, AND ELECTRONIC APPARATUS

(71) Applicant: SEIKO EPSON CORPORATION, Tokyo (JP)

(72) Inventor: Masaaki Ito, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/123,658

(22) Filed: Sep. 6, 2018

(65) Prior Publication Data

US 2019/0075647 A1    Mar. 7, 2019

(30) Foreign Application Priority Data

Sep. 7, 2017 (JP) .................. 2017-171983

(51) Int. Cl.
*H05K 1/02* (2006.01)
*H05K 3/34* (2006.01)

(52) U.S. Cl.
CPC ......... *H05K 1/0216* (2013.01); *H05K 1/0204* (2013.01); *H05K 1/0203* (2013.01); *H05K 3/3436* (2013.01); *H05K 2201/066* (2013.01)

(58) Field of Classification Search
CPC .. H05K 1/0216; H05K 1/0204; H05K 7/2039; H05K 1/0203; H05K 3/3436; H05K 2201/066; G11B 5/66; G11B 5/65; G11B 5/7325; G11B 5/7379; G11B 5/667; G11B 5/82; G11B 5/851; G11B 5/855; G11B 5/8404; G11B 2005/0021; G11B 5/1278; G11B 5/73; G11B 2005/0029;
G11B 5/3906; G11B 5/653; G11B 5/72;
H01L 43/08; H01L 43/10; H01L 21/563;
H01L 23/5225; H01L 23/552; H01F
41/16; H01F 2017/0066; H01F 41/02;
H01F 41/0233; H01F 7/081
USPC ........ 427/131, 130, 550, 127, 532; 428/827,
428/828, 831, 836, 692.1, 836.1;
257/E29.323, E43.005, 421, E23.114,
257/295, 659; 438/3
See application file for complete search history.

(56) References Cited

U.S. PATENT DOCUMENTS

| 5,864,088 A  * | 1/1999 | Sato ..................... H01L 23/552 174/386 |
| 7,323,214 B2 | 1/2008 | Wakayama et al. |
| 7,994,435 B2 | 8/2011 | Kato et al. |
| 2002/0166686 A1* | 11/2002 | Toyoda .................. H01Q 1/526 174/524 |
| 2004/0100855 A1* | 5/2004 | Saito ...................... B82Y 10/00 365/232 |

(Continued)

FOREIGN PATENT DOCUMENTS

| JP | H05-206676 A | 8/1993 |
| JP | 2002-198686 A | 7/2002 |

(Continued)

*Primary Examiner* — Mandeep S Buttar
(74) *Attorney, Agent, or Firm* — Oliff PLC

(57) ABSTRACT

A heat conducting member includes: a magnetic substance-containing layer containing a magnetic substance, the magnetic substance being oriented along a predetermined orientation direction; and a metal-containing layer containing a metal body including a surface crossing the orientation direction of the magnetic substance.

13 Claims, 2 Drawing Sheets

(56) References Cited

U.S. PATENT DOCUMENTS

| | | |
|---|---|---|
| 2005/0012652 A1 | 1/2005 | Wakayama et al. |
| 2009/0178843 A1 | 7/2009 | Kato et al. |
| 2018/0228063 A1* | 8/2018 | Dixon .................. H01L 23/552 |

FOREIGN PATENT DOCUMENTS

| | | |
|---|---|---|
| JP | 2006-179901 A | 7/2006 |
| JP | 4406484 B2 | 1/2010 |
| JP | 4978478 B2 | 7/2012 |

* cited by examiner

HEAT CONDUCTING MEMBER, PRINTED CIRCUIT BOARD, AND ELECTRONIC APPARATUS

BACKGROUND

1. Technical Field

The present invention relates to a heat conducting member, a printed circuit board, and an electronic apparatus.

2. Related Art

A heat conducting sheet for conducting the heat of an electronic element such as an LSI mounted on a printed wiring board and radiating the heat to the outside has been known in the related art.

For example, JP-A-2002-198686 discloses an electronic component sheet including an electromagnetic-wave-absorbing heat radiating layer including a magnetic substance powder, a thermally conductive powder, and resin, and an electrically conductive shield layer stacked on the electromagnetic-wave-absorbing heat radiating layer. It is described that this electronic component sheet is used such that the electromagnetic-wave-absorbing heat radiating layer is located on the side close to a source of unwanted radiation and that the electronic component sheet can effectively reduce the unwanted radiation and efficiently radiate heat from an electronic component.

In the electronic component sheet disclosed in JP-A-2002-198686, ferrite, Sendust (registered trademark), or the like is used as the magnetic substance powder, alumina, aluminum nitride, or the like is used as the thermally conductive powder, and resin containing metal foil is used as the electrically conductive shield layer. When the layers containing metal are simply stacked on one another as described above, the electromagnetic-wave-absorbing heat radiating layer may induce an electromagnetic field, which may worsen the unwanted radiation of the electromagnetic field.

SUMMARY

An advantage of some aspects of the invention is to provide a heat conducting member capable of efficiently performing both heat radiation from an electronic element and the suppression of unwanted radiation. Another advantage of some aspect of the invention is to provide a printed circuit board including the heat conducting member. Still another advantage of some aspect of the invention is to provide an electronic apparatus including the printed circuit board.

A heat conducting member according to an aspect of the invention includes: a magnetic substance-containing layer containing a magnetic substance, the magnetic substance being oriented along a predetermined orientation direction; and a metal-containing layer containing a metal body including a surface crossing the orientation direction of the magnetic substance.

In the heat conducting member according to the aspect of the invention, the magnetic substance in the magnetic substance-containing layer is oriented along the predetermined orientation direction. Therefore, for example, when an electronic element is disposed in the vicinity of the heat conducting member, a magnetic field due to unwanted radiation is induced along the orientation direction. Here, the metal body in the metal-containing layer includes the surface crossing the orientation direction (the direction of the magnetic field), and therefore, an eddy current is generated in the metal body. At this time, the eddy current results in eddy-current loss and is converted into heat, and this heat is radiated from the metal-containing layer. As described above, according to the heat conducting member according to the aspect of the invention, the unwanted radiation from the electronic element can be converted into heat, and the heat can be radiated, together with heat generated from the electronic element, to the outside.

In the heat conducting member according to the aspect of the invention, the orientation direction of the magnetic substance and the surface of the metal body may be perpendicular to each other.

According to this configuration, the magnetic field can be efficiently converted into an eddy current.

In the heat conducting member according to the aspect of the invention, one surface of the magnetic substance-containing layer and the orientation direction of the magnetic substance may be perpendicular to each other.

According to this configuration, it is easy to manufacture the magnetic substance-containing layer.

The heat conducting member according to the aspect of the invention may further include a low relative permittivity layer, and the low relative permittivity layer may be provided on a side opposite to the magnetic substance-containing layer with respect to the metal-containing layer.

According to this configuration, for example, when a heat radiating member is placed on the heat conducting member, electrical coupling between the metal-containing layer and the heat radiating member can be reduced by the low relative permittivity layer.

A printed circuit board according to an aspect of the invention includes: a printed wiring board; an electronic element provided on the printed wiring board; a heat radiating member; and the heat conducting member according to the aspect of the invention, provided between the electronic element and the heat radiating member.

According to the printed circuit board according to the aspect of the invention, unwanted radiation from the electronic element can be converted into heat, and the heat can be radiated, together with heat generated from the electronic element, from the heat radiating member to the outside.

In the printed circuit board according to the aspect of the invention, the heat conducting member may be disposed such that the magnetic substance-containing layer is located on a side on which the electronic element is disposed and that the metal-containing layer is located on a side on which the heat radiating member is disposed.

According to this configuration, a magnetic field generated from the electronic element can be efficiently converted into an eddy current, and heat due to eddy-current loss can be efficiently conducted to the heat radiating member.

In the printed circuit board according to the aspect of the invention, the heat conducting member may be disposed such that the magnetic substance-containing layer is located on a side on which the electronic element is disposed and that the low relative permittivity layer is located on a side on which the heat radiating member is disposed.

According to this configuration, electrical coupling between the metal-containing layer and the heat radiating member can be reduced by the low relative permittivity layer.

An electronic apparatus according to an aspect of the invention includes the printed circuit board according to the aspect of the invention.

According to this configuration, it is possible to provide the electronic apparatus having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
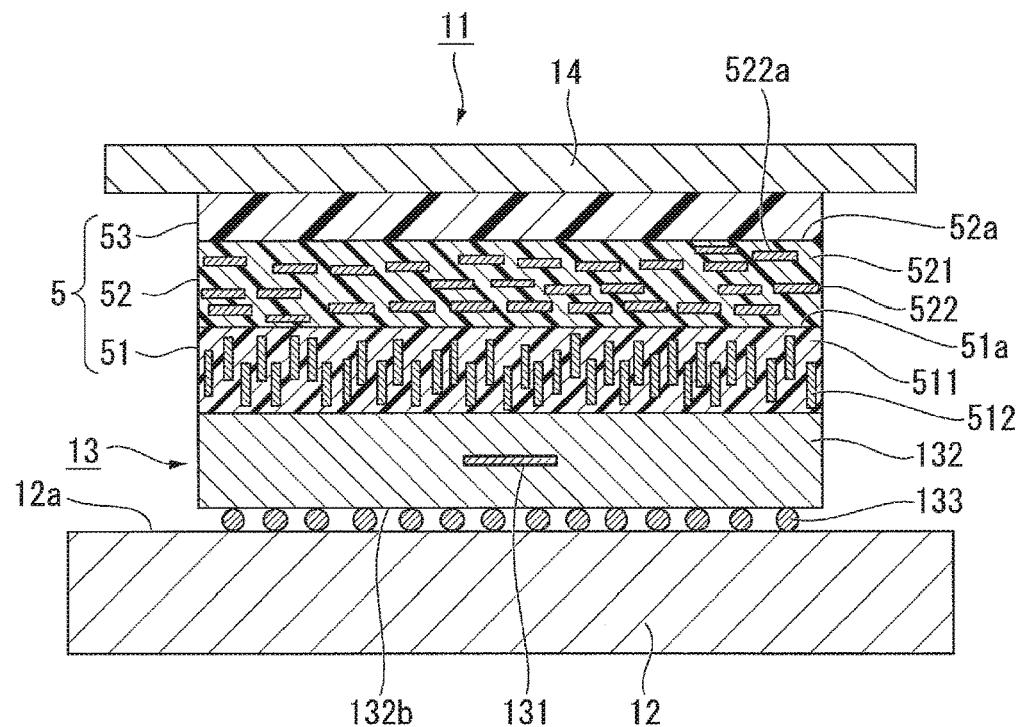
FIG. 1 is a cross-sectional view of a printed circuit board according to a first embodiment.

Hereinafter, a first embodiment of the invention will be described with reference to FIGS. 1 and 2.

In the drawings below, components may be shown in different dimension scales for the sake of clarity of each of the components.

FIG. 1 is a cross-sectional view of a printed circuit board according to the embodiment.

As shown in FIG. 1, the printed circuit board 11 according to the embodiment includes a printed wiring board 12, an LSI 13, a heat radiating plate 14, and a heat conducting sheet 5. The LSI 13 according to the embodiment corresponds to an electronic element in the appended claims. The heat radiating plate 14 according to the embodiment corresponds to a heat radiating member in the appended claims. The heat conducting sheet 5 according to the embodiment corresponds to a heat conducting member in the appended claims.

Although not shown in the drawing, the printed wiring board 12 has a configuration in which a wiring pattern made of copper foil is provided on at least one surface of a base material made of, for example, a material such as paper phenol or glass epoxy. As the printed wiring board 12, any of a single-sided printed wiring board, a double-sided printed wiring board, and a multilayer printed wiring board may be used. Moreover, as the printed wiring board 12, a rigid printed wiring board not having flexibility may be used, or a flexible printed wiring board having flexibility may be used.

The LSI 13 is provided on one surface 12a of the printed wiring board 12. The LSI 13 includes a semiconductor chip 131 made of silicon, a package 132 covering the semiconductor chip 131, and a plurality of terminals 133 provided on a surface 132b of the package 132. The LSI 13 is electrically connected with the wiring pattern of the printed wiring board 12 through the plurality of terminals 133. Moreover, although described in detail later, the LSI 13 serves as a heat-generating source and a source of unwanted radiation. Although the LSI 13 is used as an electronic element in the embodiment, other electronic elements serving as a heat-generating source and a source of unwanted radiation may be used.

The heat radiating plate 14 is composed of a flat plate made of metal having high thermal conductivity such as, for example, aluminum or copper. Although the heat radiating plate 14 is used as a heat radiating member in the embodiment, a heat sink including, for example, fins for heat radiation may be used.

The heat conducting sheet 5 is provided between the LSI 13 and the heat radiating plate 14. The heat conducting sheet 5 includes a magnetic substance-containing layer 51, a metal-containing layer 52, and a low relative permittivity layer 53. The magnetic substance-containing layer 51, the metal-containing layer 52, and the low relative permittivity layer 53 are stacked in this order from the side on which the LSI 13 is disposed. That is, the heat conducting sheet 5 is disposed such that the magnetic substance-containing layer 51 is located on the side on which the LSI 13 is disposed and that the low relative permittivity layer 53 is located on the side on which the heat radiating plate 14 is disposed.

The magnetic substance-containing layer 51 has a configuration in which a plurality of magnetic substances 512 are contained in a base material 511. Each of the plurality of magnetic substances 512 is a small piece having a shape such as a needle-like, rod-like, or plate-like shape, and has a longitudinal direction. For example, a soft magnetic material such as ferrite containing iron oxide as a main component is used as the magnetic substance 512. For example, a silicone resin, an acrylic resin, or the like is used as the base material 511.

The plurality of magnetic substances 512 have anisotropy. Specifically, the plurality of magnetic substances 512 are oriented inside the magnetic substance-containing layer 51 such that the longitudinal directions of the magnetic substances 512 are oriented in a direction substantially perpendicular to a surface 51a of the magnetic substance-containing layer 51. Hereinafter, the direction in which the plurality of magnetic substances 512 are oriented is referred to as "orientation direction of the magnetic substance 512". That is, the plurality of magnetic substances 512 are oriented along a predetermined orientation direction in the magnetic substance-containing layer 51. Further, the one surface 51a of the magnetic substance-containing layer 51 and the predetermined orientation direction of the plurality of magnetic substances 512 are perpendicular to each other. Although the surface 51a of the magnetic substance-containing layer 51 is defined as a surface of the magnetic substance-containing layer 51 on the side on which the metal-containing layer 52 to be described later is disposed in the embodiment, the surface 51a may be a surface on the side on which the LSI 13 is disposed.

In an actual magnetic substance-containing layer 51, all of the plurality of magnetic substances 512 are not necessarily oriented in exactly the same direction, but the orientation direction may conceivably vary. In that case, the average orientation direction of the plurality of magnetic substances 512 is deemed as the orientation direction of the magnetic substance 512, and it is sufficient that the orientation direction is substantially perpendicular to the surface 51a of the magnetic substance-containing layer 51.

In forming the magnetic substance-containing layer configured as described above, a magnetic substance-containing layer material made of the base material 511 containing the plurality of magnetic substances 512 is prepared, this magnetic substance-containing layer material is placed in a strong magnetic field to orient the plurality of magnetic substances 512 in the predetermined orientation direction, and thereafter, the base material 511 is cured.

The metal-containing layer 52 has a configuration in which a plurality of metal bodies 522 are contained in a base material 521. The metal body 522 is composed of, for example, a minute plate-like piece of metal. For example, a metal material containing copper, iron, or the like as a main component is used as the metal body 522. For example, a silicone resin, an acrylic resin, or the like is used as the base material 521. By using the same kind of material for the base material 511 of the magnetic substance-containing layer 51 and the base material 521 of the metal-containing layer 52, the magnetic substance-containing layer 51 and the metal-containing layer 52 can be easily bonded together using a method such as pressure bonding without using an adhesive or the like.

The plurality of metal bodies 522 each include a surface 522a crossing the orientation direction of the magnetic substance 512, and have anisotropy. Specifically, the plurality of metal bodies 522 are oriented inside the metal-containing layer 52 such that the surfaces 522a of the metal bodies 522 are oriented in a direction substantially parallel to a surface 52a of the metal-containing layer 52. Hereinafter, the direction in which the plurality of metal bodies 522 are oriented is referred to as "orientation direction of the metal body 522". Hence, the orientation direction of the magnetic substance 512 and the surface 522a of the metal body 522 are perpendicular to each other. Although the surface 52a of the metal-containing layer 52 is defined as a surface of the metal-containing layer 52 on the side on which the low relative permittivity layer 53 to be described later is disposed in the embodiment, the surface 52a may be a surface on the side on which the magnetic substance-containing layer 51 is disposed.

In an actual metal-containing layer 52, all of the surfaces 522a of the plurality of metal bodies 522 are not necessarily oriented in exactly the same direction, but the orientation may conceivably vary. In that case, the average orientation of the surfaces 522a of the plurality of metal bodies 522 is deemed as the orientation of the surface 522a of the metal body 522, and it is sufficient that the surface 522a is substantially perpendicular to the orientation direction of the magnetic substance 512.

The low relative permittivity layer 53 is made of a low permittivity material having a relative permittivity of 10 or less. More preferably, the low relative permittivity layer 53 is made of a low permittivity material having a relative permittivity of 6 or less. In the embodiment, for example, an acrylic resin or the like is used as the low permittivity material. When the low relative permittivity layer 53 is provided between an object and an object, the low relative permittivity layer 53 reduces electrical coupling between the objects. In the embodiment, the low relative permittivity layer 53 is provided on the metal-containing layer 52 on the side opposite to the magnetic substance-containing layer 51.

Hereinafter, the operation and effect of the printed circuit board 11 configured as described above will be described.

Figure 2:
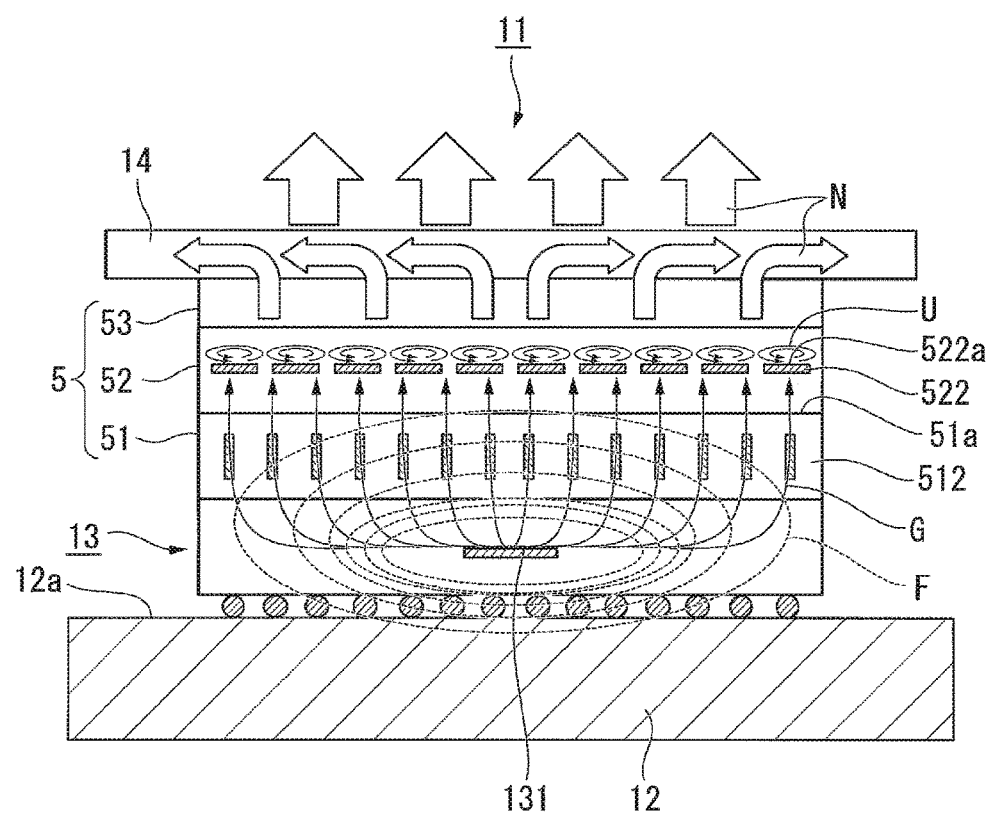
FIG. 2 is a diagram for explaining the operation and effect of the printed circuit board.

As shown in FIG. 2, in the printed circuit board 11 according to the embodiment, unwanted radiation noise of an electromagnetic field is generated from the semiconductor chip 131 during the operation of the LSI 13. That is, the LSI 13 as an electronic element serves as a source of unwanted radiation. Moreover, the semiconductor chip 131 included in the LSI 13 is heated to high temperatures during operation; therefore, the LSI 13 also serves as a heat-generating source. The curves denoted by reference sign F represent an electric field generated by the unwanted radiation noise.

In the printed circuit board 11, the magnetic substances 512 are oriented in the predetermined orientation direction, that is, along the direction perpendicular to the surface 51a of the magnetic substance-containing layer 51. The soft magnetic material constituting the magnetic substance 512 has a high magnetic permeability and a low magnetic resistance; therefore, a magnetic field G is induced such that the direction of the magnetic field G is along the orientation direction of the magnetic substance 512 inside the magnetic substance-containing layer 51. In this manner, the magnetic field G directed in the direction perpendicular to the surface 51a of the magnetic substance-containing layer 51 is formed.

Further, the metal body 522 includes the surface 522a orthogonal to the orientation direction of the magnetic substance 512, that is, to the direction of the magnetic field G; therefore, an eddy current U is generated inside each of the metal bodies 522 by electromagnetic induction when the magnetic field G strikes the surface 522a of the metal body 522. Moreover, the electrical coupling between the metal-containing layer 52 and the heat radiating plate 14 is reduced by the low relative permittivity layer 53; therefore, the eddy current U does not flow into the heat radiating plate 14, but the eddy current U results in eddy-current loss and is converted into heat. Especially, the relative permittivity of the low relative permittivity layer 53 is as low as 10 or less; therefore, an electrical resistance is high, and the flow of an electromagnetic wave (unwanted radiation) toward the heat radiating plate 14 is sufficiently suppressed. Hence, the low relative permittivity layer 53 attenuates the unwanted radiation noise and transfers the heat converted from the eddy current U to the heat radiating plate 14.

On the other hand, the LSI 13, the magnetic substance-containing layer 51, the metal-containing layer 52, the low relative permittivity layer 53, and the heat radiating plate 14 are thermally connected to one another; therefore, the heat generated from the semiconductor chip 131 during the operation of the LSI 13 is transferred to the heat radiating plate 14 through the magnetic substance-containing layer 51, the metal-containing layer 52, and the low relative permittivity layer 53, and is diffused inside the heat radiating plate 14. Moreover, as described above, the heated generated due to eddy-current loss is also transferred from the metal-containing layer 52 to the heat radiating plate 14 through the low relative permittivity layer 53. These heats are radiated from the heat radiating plate 14 to the outside. In FIG. 2, the flow of heat is shown by arrows N.

As has been described above, according to the printed circuit board 11 including the heat conducting sheet 5 according to the embodiment, the unwanted radiation noise generated from the LSI 13 is converted into heat and thus attenuated, and the converted heat can be transferred, together with heat generated from the LSI 13, to the heat radiating plate 14 and radiated from the heat radiating plate 14 to the outside. In this manner, it is possible to efficiently perform both the heat radiation from the LSI 13 and the suppression of unwanted radiation noise.

Moreover, in the case of the embodiment, the orientation direction of the magnetic substance 512 and the surface 522a of the metal body 522 are perpendicular to each other; therefore, the magnetic field G can be efficiently converted into the eddy current U. Moreover, the surface 51a of the magnetic substance-containing layer 51 and the orientation direction of the magnetic substance 512 are perpendicular to each other; therefore, it is easy to manufacture the magnetic substance-containing layer 51.

In the case of the embodiment, the base material 521 of the metal-containing layer 52 is composed of an insulator such as a silicone resin or an acrylic resin, and further, the low relative permittivity layer 53 is provided between the metal-containing layer 52 and the heat radiating plate 14. Therefore, insulation between the metal-containing layer 52 and the heat radiating plate 14 is sufficiently secured. With this configuration, the unwanted radiation noise can be still further suppressed.

Second Embodiment

Hereinafter, a second embodiment of the invention will be described with reference to FIG. 3.

A printed circuit board according to the second embodiment has a basic configuration similar to that of the first embodiment, but differs from that of the first embodiment in that a heat conducting sheet does not include the low relative permittivity layer 53 according to the first embodiment.

Figure 3:
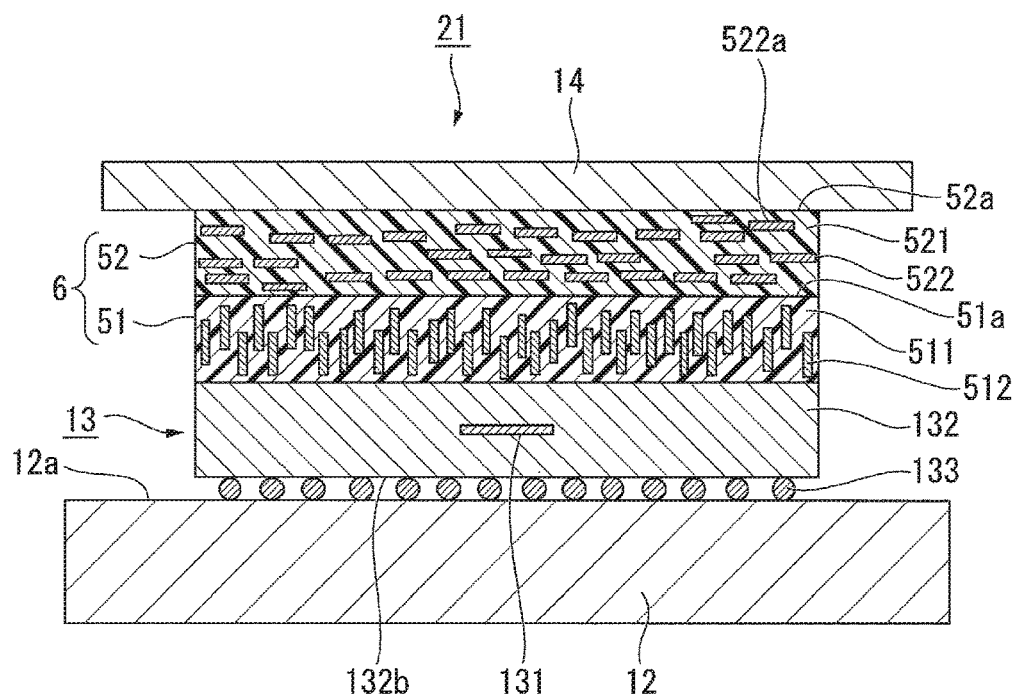
FIG. 3 is a cross-sectional view of a printed circuit board according to a second embodiment.

FIG. 3 is a cross-sectional view of the printed circuit board according to the embodiment.

In FIG. 3, components common to those in FIG. 1 used in the first embodiment are denoted by the same reference numerals and signs, and the description of the components is omitted.

As shown in FIG. 3, the printed circuit board 21 according to the embodiment includes the printed wiring board 12, the LSI 13, the heat radiating plate 14, and the heat conducting sheet 6. The heat conducting sheet 6 is provided between the LSI 13 and the heat radiating plate 14. The heat conducting sheet 6 includes the magnetic substance-containing layer 51 and the metal-containing layer 52.

The heat conducting sheet 6 according to the embodiment includes the metal-containing layer 52 in contact with the heat radiating plate 14, but does not include the low relative permittivity layer 53 according to the first embodiment. The heat conducting sheet 6 is disposed such that the magnetic substance-containing layer 51 is located on the side on which the LSI 13 is disposed and that the metal-containing layer 52 is located on the side on which the heat radiating plate 14 is disposed.

Also in the printed circuit board 21 according to the embodiment, it is possible to efficiently perform both the heat radiating from the LSI 13 and the suppression of unwanted radiation noise, similarly to the first embodiment.

Further, the heat conducting sheet 6 according to the embodiment does not include the low relative permittivity layer 53; therefore, cost reduction and thinning are achieved.

Third Embodiment

Hereinafter, a third embodiment of the invention will be described with reference to FIG. 4.

A printed circuit board according to the third embodiment has a basic configuration similar to that of the first embodiment, but differs from that of the first embodiment in that a heat conducting sheet includes a metal-containing layer different from the metal-containing layer 52 according to the first embodiment.

Figure 4:
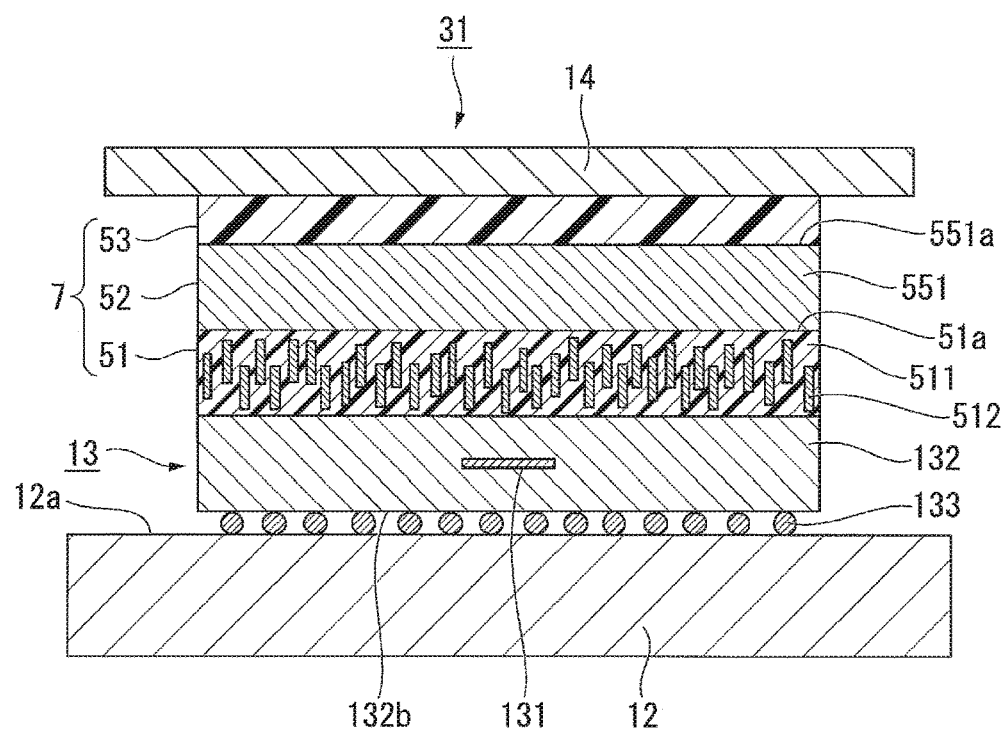
FIG. 4 is a cross-sectional view of a printed circuit board according to a third embodiment.

FIG. 4 is a cross-sectional view of the printed circuit board according to the embodiment.

In FIG. 4, components common to those in FIG. 1 used in the first embodiment are denoted by the same reference numerals and signs, and the description of the components is omitted.

As shown in FIG. 4, the printed circuit board 31 according to the embodiment includes the printed wiring board 12, the LSI 13, the heat radiating plate 14, and the heat conducting sheet 7. The heat conducting sheet 7 is provided between the LSI 13 and the heat radiating plate 14. The heat conducting sheet 7 includes the magnetic substance-containing layer 51, the metal-containing layer 55, and the low relative permittivity layer 53. The magnetic substance-containing layer 51, the metal-containing layer 55, and the low relative permittivity layer 53 are stacked in this order from the side on which the LSI 13 is disposed. That is, the heat conducting sheet 7 is disposed such that the magnetic substance-containing layer 51 is located on the side on which the LSI 13 is disposed and that the low relative permittivity layer 53 is located on the side on which the heat radiating plate 14 is disposed.

In the first and second embodiments, the metal-containing layer 52 includes the plurality of metal bodies 522 contained in the base material 521 and each composed of a minute plate-like piece of metal. In contrast, in the heat conducting sheet 7 according to the embodiment, the entire metal-containing layer 55 is composed of one plate-like metal body 551. For example, a metal material containing copper, iron, or the like as a main component is used as the metal body 551. The metal body 551 includes a surface 551a parallel to the surface 51a of the magnetic substance-containing layer 51 and crossing the orientation direction of the magnetic substance 512. More specifically, the orientation direction of the magnetic substance 512 and the surface 551a of the metal body 551 are perpendicular to each other. Although the surface 551a of the metal-containing layer 55 is defined as a surface of the metal-containing layer 55 on the side on which the low relative permittivity layer 53 is disposed in the embodiment, the surface 551a may be a surface on the side on which the magnetic substance-containing layer 51 is disposed.

Also in the printed circuit board 31 according to the embodiment, it is possible to efficiently perform both the heat radiation from the LSI 13 and the suppression of unwanted radiation noise, similarly to the embodiments.

Further, in the case of the embodiment, the entire metal-containing layer 55 is composed of the plate-like metal body 551; therefore, it is easy to form the metal-containing layer 55.

Electronic Apparatus

Examples of an electronic apparatus according to an embodiment of the invention include various electronic apparatuses including, for example, a display device such as a projector. These electronic apparatuses include the printed circuit board according to any of the embodiments.

The technical scope of the invention is not limited to the embodiments, but various modifications can be added within the range not departing from the gist of the invention.

For example, the orientation direction of the magnetic substance and the surface of the metal body are perpendicular to each other in the embodiments; however, the orientation direction of the magnetic substance and the surface of the metal body may not necessarily be perpendicular to each other, but it is sufficient that they cross each other. With this configuration, an eddy current can be generated. Moreover, the surface of the magnetic substance-containing layer and the orientation direction of the magnetic substance may not necessarily be perpendicular to each other, but it is sufficient that they cross each other.

Moreover, in the embodiments, the metal-containing layer includes the plate-like metal body; however, the metal body may not necessarily be plate-like. It is sufficient that the metal body includes a surface crossing the orientation direction of the magnetic substance and can cause an eddy current.

Specific configurations such as the shape, dimension, arrangement, and number of components constituting each of the heat conducting member and the printed circuit board can be appropriately changed. For example, the heat conducting member may not be sheet-like.

The entire disclosure of Japanese Patent Application No. 2017-171983, filed Sep. 7, 2017 is expressly incorporated by reference herein.

What is claimed is:

1. A heat conducting member comprising:
a magnetic substance-containing layer containing a magnetic substance, the magnetic substance being magnetically oriented along a predetermined orientation direction parallel to a longitudinal axis of the magnetic substance; and
a metal-containing layer containing a metal body including a surface crossing the orientation direction of the magnetic substance, the surface facing the magnetic substance-containing layer.

2. The heat conducting member according to claim 1, wherein the orientation direction of the magnetic substance and the surface of the metal body are perpendicular to each other.

3. The heat conducting member according to claim 2, wherein one surface of the magnetic substance-containing layer and the orientation direction of the magnetic substance are perpendicular to each other.

4. A printed circuit board comprising:
a printed wiring board;
an electronic element provided on the printed wiring board;
a heat radiation member; and
the heat conducting member according to claim 1, provided between the electronic element and the heat radiation member.

5. The printed circuit board according to claim 4, wherein the heat conducting member is disposed such that the magnetic substance-containing layer is located on a side on which the electronic element is disposed and that the metal-containing layer is located on a side on which the heat radiation member is disposed.

6. An electronic apparatus comprising the printed circuit board according to claim 4.

7. An electronic apparatus comprising the printed circuit board according to claim 5.

8. The heat conducting member according to claim 1, wherein the predetermined orientation direction is perpendicular to a face of the magnetic substance-containing layer facing the metal-containing layer.

9. A heat conducting member comprising:
a magnetic substance-containing layer containing a magnetic substance, the magnetic substance being oriented along a predetermined orientation direction;
a metal-containing layer containing a metal body including a surface crossing the orientation direction of the magnetic substance; and
a low relative permittivity layer,
wherein the low relative permittivity layer is provided on a side opposite to the magnetic substance-containing layer with respect to the metal-containing layer.

10. A printed circuit board comprising:
a printed wiring board;
an electronic element provided on the printed wiring board;
a heat radiation member; and
the heat conducting member according to claim 4, provided between the electronic element and the heat radiation member.

11. The printed circuit board according to claim 10, wherein the heat conducting member is disposed such that the magnetic substance-containing layer is located on a side on which the electronic element is disposed and that the low relative permittivity layer is located on a side on which the heat radiation member is disposed.

12. An electronic apparatus comprising the printed circuit board according to claim 10.

13. An electronic apparatus comprising the printed circuit board according to claim 11.

* * * * *